US005580421A

United States Patent [19]
Hiatt et al.

[11] Patent Number: 5,580,421
[45] Date of Patent: Dec. 3, 1996

[54] APPARATUS FOR SURFACE CONDITIONING

[75] Inventors: C. Fred Hiatt, Burnsville, Minn.; David C. Gray, Sunnyvale, Calif.; Jeffery W. Butterbaugh, Chanhassen, Minn.

[73] Assignee: FSI International, Chanhassen, Minn.

[21] Appl. No.: 360,387

[22] Filed: Dec. 21, 1994

Related U.S. Application Data

[63] Continuation-in-part of Ser. No. 292,359, Aug. 18, 1994, Pat. No. 5,534,107, which is a continuation-in-part of Ser. No. 259,542, Jun. 14, 1994.

[51] Int. Cl.⁶ .................................................. H01L 21/00
[52] U.S. Cl. .................. 150/643.1; 156/345; 156/646.1; 216/66
[58] Field of Search ........................ 156/626.1, 635.1, 156/646.1, 345 MC, 345 J, 345 P, 643.1; 216/58, 59, 66

[56] References Cited

U.S. PATENT DOCUMENTS

| | | |
|---|---|---|
| 2,841,477 | 7/1958 | Hall . |
| 3,122,463 | 2/1964 | Ligenza et al. . |
| 4,028,135 | 6/1977 | Vig et al. . |
| 4,158,589 | 6/1979 | Keller et al. . |
| 4,183,780 | 1/1980 | McKenna et al. . |
| 4,259,145 | 3/1981 | Harper . |
| 4,260,649 | 4/1981 | Dension et al. . |
| 4,485,027 | 10/1984 | Pressley . |
| 4,508,749 | 4/1985 | Brannon et al. . |
| 4,522,674 | 6/1985 | Ninomiya et al. . |
| 4,540,466 | 9/1985 | Nishizawa . |
| 4,643,799 | 2/1987 | Tsujii et al. . |
| 4,678,536 | 7/1987 | Murayama et al. . |
| 4,687,544 | 8/1967 | Bersin . |
| 4,705,593 | 11/1987 | Haigh et al. . |
| 4,731,158 | 5/1988 | Brannon . |

(List continued on next page.)

FOREIGN PATENT DOCUMENTS

| | | |
|---|---|---|
| 4014351 | 11/1990 | Germany . |
| 57-200569 | 12/1982 | Japan . |
| 63-297563 | 12/1988 | Japan . |
| 91/03075 | 3/1988 | WIPO . |

OTHER PUBLICATIONS

"Laser Chemical Technique for Rapid Direct Writing of Surface Relief in Silicon" by D. J. Ehrlich et al, *Appl. Phys. Lett.* 38(12), 1981.

"Laser Induced Microscopic Etching of GaAs and InP" by D. H. Ehrlich et al, *Appl. Phys. Lett.* 36(8), 1980.

"Laser Etching and Metallization of Silicon" by Sam Marshall, *State Technology*/Oct. 1982.

Primary Examiner—William Powell
Attorney, Agent, or Firm—Vidas, Arrett & Steinkraus, P.A.

[57] ABSTRACT

Apparatus and process for conditioning a substrate, contained in a hermetically sealed chamber fed with a conditioning gas which includes a reactive gas, the apparatus including a support for supporting the substrate in the chamber, the substrate being in a lower pressure reaction region of the chamber. A gas inlet is provided for feeding conditioning gas into a gas inlet region of the chamber which is at a higher pressure than the lower pressure reaction region so that the pressure differential causes the conditioning gas to flow toward the surface of the substrate wherein the conditioning gas component will chemically react with and condition the substrate surface, both said higher and lower pressure regions operating in a viscous flow regime. The substrate is supported such that a pressure bias is created across the surface of the substrate such that the gas, after it has chemically reacted with the substrate surface, flows radially outward from where it has reacted, toward the nearest edge of the substrate and out an exhaust outlet.

36 Claims, 7 Drawing Sheets

U.S. PATENT DOCUMENTS

| | | |
|---|---|---|
| 4,741,800 | 5/1988 | Yamazaki . |
| 4,749,440 | 6/1988 | Blackwood et al. . |
| 4,756,047 | 7/1988 | Haysashi et al. . |
| 4,870,923 | 10/1989 | Sugimoto . |
| 4,871,416 | 10/1989 | Fukuda . |
| 4,986,216 | 1/1991 | Ohmori et al. ............ 118/730 |
| 5,004,311 | 4/1991 | Peppers . |
| 5,022,961 | 6/1991 | Izumi et al. . |
| 5,024,968 | 6/1991 | Engelsberg . |
| 5,228,206 | 7/1993 | Grant et al. . |
| 5,236,512 | 4/1983 | Rogers et al. . |
| 5,288,684 | 2/1994 | Yamazaki et al. ............ 156/345 V |
| 5,332,442 | 7/1994 | Kubodera et al. ............ 118/725 |

APPARATUS FOR SURFACE CONDITIONING

CROSS-REFERENCE TO RELATED APPLICATIONS

This application is a continuation-in-part of Ser. No. 08/292,359 filed Aug. 18, 1994, now U.S. Pat. No. 5,534,107, which is a continuation-in-part of Ser. No. 08/259,542, filed Jun. 14, 1994, both of which are incorporated herein by reference.

BACKGROUND OF THE INVENTION

1. Field of the Invention

The present invention relates to an apparatus which provides for the conditioning of the surface of a substrate in a plasma-less gas phase environment. It finds particular application in etching, cleaning, or bulk stripping removal of films or contaminants from the surface of a semiconductor wafer for use in the fabrication of integrated circuits.

2. Description of the Related Art

The current standard for surface contamination removal in the semiconductor industry is commonly known as the RCA clean and makes use of liquid aqueous chemical. Highly selective bulk film stripping is also commonly carried out within liquid aqueous chemicals. The attendant problems of liquid aqueous chemical processes which include safety, waste disposal, cleanliness and cost, make the use of gaseous processes very attractive.

The use of plasma containing reactive gas mixtures or reactive ion etching (RIE) are an alternative to liquid aqueous chemical processes. In these type of processes, the container is filled with a low pressure gas, the substrate is inserted into the container along with a reactive etchant gas. Voltage is applied to excite the gas, which chemically reacts with the surface. These types of processes have the disadvantage of causing additional damage and contamination of the substrate surface. It is also known to use the effluent of a gas plasma having at least one reactive specie, but being substantially free of electrically charged particles. This is known in the art as a downstream plasma source and is shown in U.S. Pat. No. 4,687,544 to Bersin, entitled "Method And Apparatus For Dry Processing of Substrates".

Plasma-less UV treatments have also been disclosed before. For example, U.S. Pat. No. 2,841,477 to Hall, entitled "Photochemically Activated Gaseous Etching Method" is the earliest known reference teaching a process of using a photochemically activated gas to etch semiconductor materials. This reference shows an etching method involving the steps of immersing the semiconductor material in a photolyzable gas and directing UV light toward the portion of the material to be etched. The gas is apparently static. The UV light causes the photolyzable gas to dissociate into various chemically active species which react with the substrate surface.

U.S. Pat. No. 3,122,463 to Ligenza, entitled "Etching Technique for Fabricating Semiconductor Or Ceramic Devices" is another example showing a method of using photochemically activated $F_2O$ gas to etch semiconductor materials. This reference shows a method of immersing the semiconductor material in a static gas and directing UV light toward the portion of the material to be etched.

Processes of the type disclosed in Hall or Ligenza have the disadvantage of non-uniform gas distribution and the static gas does not allow transport of etching product and contamination out of the reactor.

It has been known to use a flow of gas across the surface of a substrate in an etching process. For example, U.S. Pat. No. 5,022,961 to Izumi et al, entitled "Method For Removing A film On A Silicon Layer Surface" shows a method of directing gas across the surface of a wafer which chemically reacts with the surface. Such processes reduce accumulation of contamination and residue at the wafer surface.

U.S. Pat. No. 4,749,440 to Blackwood et al, entitled "Gaseous Process And Apparatus For Removing Films From Substrates" assigned to FSI Corporation and Texas Instruments Inc. shows a device which causes anhydrous reactive gas to flow over the substrate in the presence of water vapor, to chemically react with the surface.

U.S. Pat. No. 5,228,206 to Grant et al, entitled "Cluster Tool Dry Cleaning System" shows a device which directs a flow of reactive gas across the surface of a substrate and asserts that UV radiation causes the gas to photochemically react with the substrate surface. Grant further teaches rotating the substrate surface to obtain more uniform UV flux on the substrate surface.

Examples of plasma-less gaseous processes include, in addition to the UV activated processes of Hall and Ligenza, the non-UV processes disclosed in the Blackwood and Izumi references and the UV-activated processes disclosed in copending application Ser. No. 08/292,359 filed Aug. 18, 1994 and in copending application Ser. No. 08/259,542 filed Jun. 14, 1994, both of which are hereby incorporated by reference.

Applicants have found that systems of the type directing a flow of gas which chemically reacts, with or without photochemical activation, with the substrate as it flows across the surface provides undesirable non-uniform etching, cleaning or bulk stripping. Typically, more etching takes place on the side of the substrate were the flow starts, and less reaction occurs as the gas flows across the surface due to depletion of reactant gas. Applicants have also found that a device employing rotation of the substrate, in combination with the flow of gas across the substrate can cause a vortex or eddy effect which also can produce undesirable nonuniform effects.

All of the methods or devices discussed above have the disadvantage of either non-uniform gas distribution or non-uniform UV illumination, and the further disadvantage that none of the prior processes remove gas which has reacted with the substrate in a manner which minimizes the risk of further contamination.

In JP 57-200569 (1982) there is disclosed an apparatus for treating a wafer with a UV activated gas, the gas being activated while in a first high pressure region. The gas is passed through a single slit to a lower pressure region where it contacts a wafer carried on a belt moving under the slit.

U.S. Pat. No. 4,540,466 entitled "Method Of Fabricating Semiconductor Device By Dry Process Utilizing Photochemical Reaction, and Apparatus Therefor" to Nishizawa and assigned to Semiconductor Research Foundation, shows a device with a higher pressure gas region and a lower pressure gas region, which causes the reactive gas to flow toward the substrate surface, as opposed to directing the flow across the surface as discussed above in connection with Izumi, Blackwood or Grant. The mean free path of the gaseous particles in the high pressure region is shorter than the openings between the two regions, i.e. a viscous flow regime. The pressure in the lower pressure region is set to provide a mean free path of the gaseous particles which is greater than the diameter of the chamber, i.e. a molecular flow regime. Nishizawa does not consider the hydrodynamics at the substrate surface, but the molecular flow regime in the lower pressure region precludes a radial laminar flow of gas across the substrate surface.

SUMMARY OF THE INVENTION

The purpose of the present invention is to provide an apparatus for conditioning of the surface of a substrate in a plasma-less gas phase environment and which overcomes the limitations of the prior art described above. The invention overcomes the limitations discussed above by creating a uniform radial circumferential gas flow which causes the gas, after it has reacted with the substrate surface, to flow radially outward to the substrate edge. The invention also overcomes the limitations discussed above by operating in a viscous flow regime. The present invention can be used to perform all of the plasma-less methods discussed above in connection with the prior art, and to obtain better results.

The present invention overcomes the problems described above by providing an apparatus and process for conditioning a substrate, such as a silicon wafer, contained in a hermetically sealed chamber fed with a conditioning gas including a reactive gas. The apparatus includes support means for supporting the substrate in the chamber, and first pressure bias means for establishing a first pressure bias in the chamber such that the substrate is in a second lower pressure portion of the chamber than a first gas inlet portion of the chamber, both said first and second chamber portions operating in a viscous flow regime. A gas inlet means for feeding conditioning gas into the gas inlet portion of the chamber is provided so that the pressure differential causes the conditioning gas to flow toward the surface of the substrate where the reactive gas component thereof will chemically react with and condition the substrate surface. A second pressure bias means is provided for creating a second pressure bias across the surface of the substrate such that the conditioning gas, after it has chemically reacted with the substrate surface, flows radially outward from where it has reacted, toward the nearest edge of the substrate, where an exhaust means exhausts gas from the chamber.

The conditioning gas may be a UV activatible gas and the apparatus may further include a light generator provided externally of the chamber to irradiate the conditioning gas with UV light of sufficient intensity so that conditioning gas activation may take place directly at the substrate surface.

The chamber and substrate may be circular and the second pressure bias means may be comprised of a substrate support means for supporting the substrate so that a uniform peripheral gap is formed between the substrate and the chamber wall, and so that a pumpout gap is formed between the substrate and the exhaust outlet. A circular outlet means may be located centrally beneath the substrate, connected to the exhaust means for exhausting gas from the chamber. The pressure at the circular outlet means is arranged such that a pressure bias is formed on the substrate surface causing the conditioning gas, after it has chemically reacted with the substrate surface and flowed radially outward toward the nearest edge of the substrate, it flows through the peripheral gap, through the pumpout gap and out the circular outlet means.

The first pressure bias means may include feeding means for feeding the gas into a gas inlet region in the chamber, the bottom of the gas inlet region may be a perforated layer of material which is transparent to a predetermined wavelength range of light. The flow conductance of the gas inlet region is greater than the flow conductance of the perforations, such that the gas fills the gas inlet region and the flow of gas through each perforation is substantially equal. The substrate is supported at a distance below the perforated layer of material such that the diffusion velocity of the gas after it has passed through the perforations is such that it will uniformly mix with the gas already resident over the substrate before it reaches the substrate surface whereby the flow of gas toward the surface of the substrate is laterally uniform over the substrate surface.

The top of the gas inlet region may be defined by a solid layer of material which is transparent to a predetermined wavelength range of light and which is spaced above the perforated layer of material. The conditioning gas is fed into an annular channel which opens into the gas inlet region and the flow conductance of the annular channel is large compared to the flow conductance of the gas inlet region so that the pressure in the annular channel is substantially equal around its entire circumference, whereby an even flow of conditioning gas from the annular channel to the center of the perforated plate is provided.

A heating means for heating the substrate may be provided. The heating means may be an infrared light generator provided externally of the chamber, the light being of sufficient intensity to heat the surface of the wafer to a predetermined temperature. Alternatively, the heating means may be a heater plate assembly supporting the substrate, and where the peripheral gap is defined by the gap between the chamber wall and the heater plate assembly, and the pumpout gap is defined between the heater plate assembly and a baffle plate, the heater plate assembly being mounted on the baffle plate and the circular outlet means being located in the baffle plate centrally beneath the heater plate assembly and the substrate.

The substrate may be supported on the heater plate assembly such that a gap exists between the substrate and the heater plate assembly to allow the flow of conditioning gas to reach the bottom surface of the substrate.

A heater plate rotating means may be provided for rotating the heater plate assembly to cause a more uniform incidence of irradiating light to enable more uniform gas activation of the conditioning gas at the substrate.

A means may be provided for vertically raising the support means within the chamber after the substrate is loaded into the chamber to define a lower volume reaction chamber.

An inert gas may be fed into the chamber. The pressure in the pumpout gap is set lower than the pressure in the chamber under the support means and an inert gas is fed into the chamber below the support means at a pressure which is between the pressure above the substrate surface and the pressure in the pumpout gap, to prevent conditioning gas from flowing below the support means, the inert gas being exhausted through the centrally located circular outlet means along with the conditioning gas.

Various sensors may also be provided for use with the apparatus. For example a substrate temperature sensor means for measuring the temperature of the substrate during processing; a pressure sensor means for measuring the pressure in the chamber, and a gas sensor means for monitoring the gas species present in the chamber.

The perforations in the perforated layer of material may be circular, the diameter of each perforation may be equal, and the perforations may be formed in a grid pattern.

BRIEF DESCRIPTION OF THE DRAWINGS

A detailed description of the invention is hereafter described with specific reference being made to the drawings in which.

DESCRIPTION OF THE PREFERRED EMBODIMENTS

While this invention may be embodied in many different forms, there are shown in the drawings and described in detail herein specific preferred embodiments of the invention. The present disclosure is an exemplification of the principles of the invention and is not intended to limit the invention to the particular embodiments illustrated.

Figure 1:
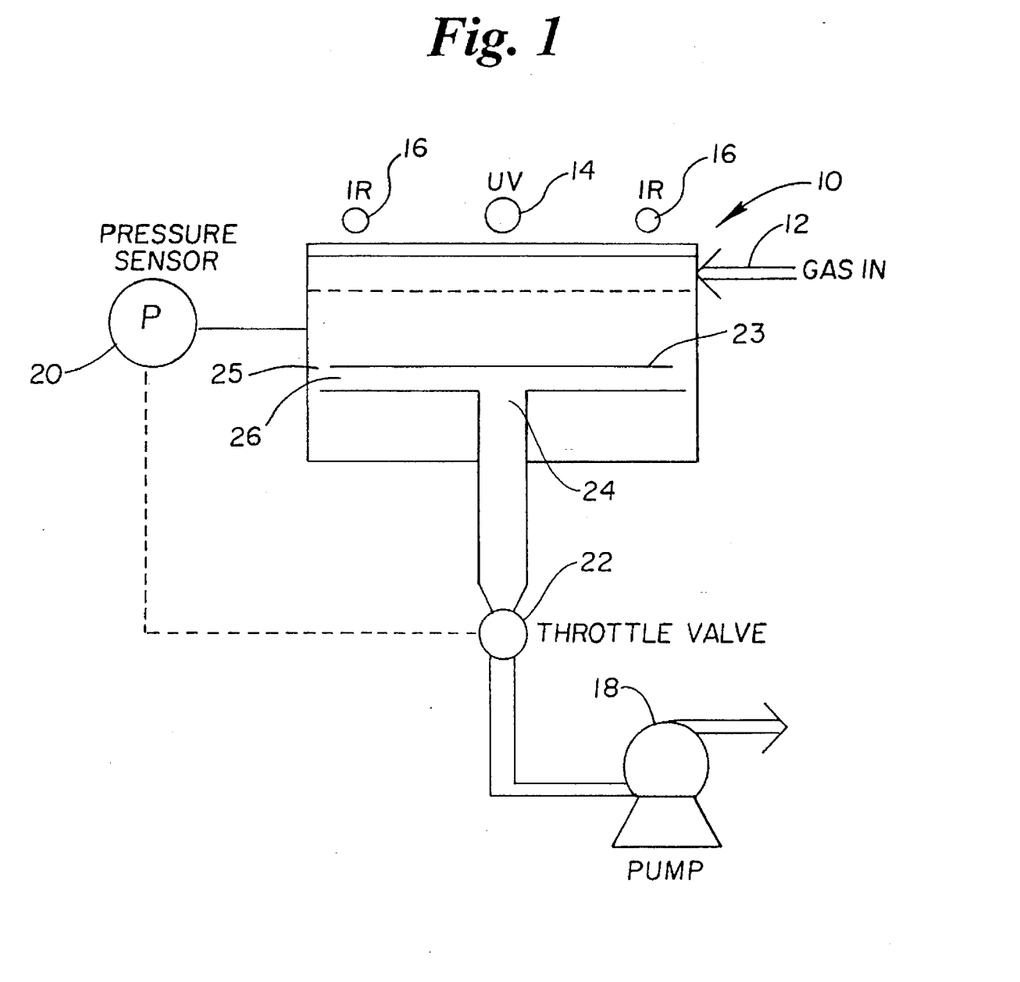
FIG. 1 is a schematic diagram of a first embodiment of the inventive apparatus.

FIG. 1 is a schematic diagram of the major component parts of the system which make up the inventive apparatus. The inventive hermetically sealed chamber is shown generally at 10. The gas supply inlet is shown at 12 and is connected to the chamber 10, as discussed further below. An optional ultraviolet lamp is shown at 14, which is used to activate the conditioning gas, as is well known in the art. Optional infrared lamps are shown at 16 which can be used to heat the substrate, as is well known in the art. A vacuum pump 18 is connected to the chamber 10. A pressure sensor 20 positioned near the chamber wall and above the substrate, measures the pressure in the chamber 10 and provides this information to the pressure control 22, which controls the pumping speed to control the vacuum level in the chamber 10. In operation, the gas is fed into a first region of the chamber 10 (shown above the dotted line of FIG. 1). The gas uniformly flows from the first region to a second region, shown under the dotted line of FIG. 1, and toward the surface of the wafer 23. The pressure drop between the inlet and the circular exhaust outlet 24 is small and a viscous flow regime is established in both the first and second regions. A peripheral gap 25 is defined between the edge of wafer 23 and the wall of chamber 10. A pumpout gap 26 is defined between the wafer 23 and the exhaust outlet 24, which is centrally located beneath the wafer 23. The peripheral gap 25, the pumpout gap 26, the centrally located circular exhaust outlet 24 and the pressure bias set at the exhaust outlet 24 create a uniform radial circumferential gas flow which causes the gas, after it has reacted with the wafer surface, to flow radially outward to the wafer edge, then through the peripheral gap 25, under the surface of the wafer and out the exhaust outlet 24. The invention lies in the design of the chamber 10, and components 12–22 are considered well known in the art.

Figure 2:
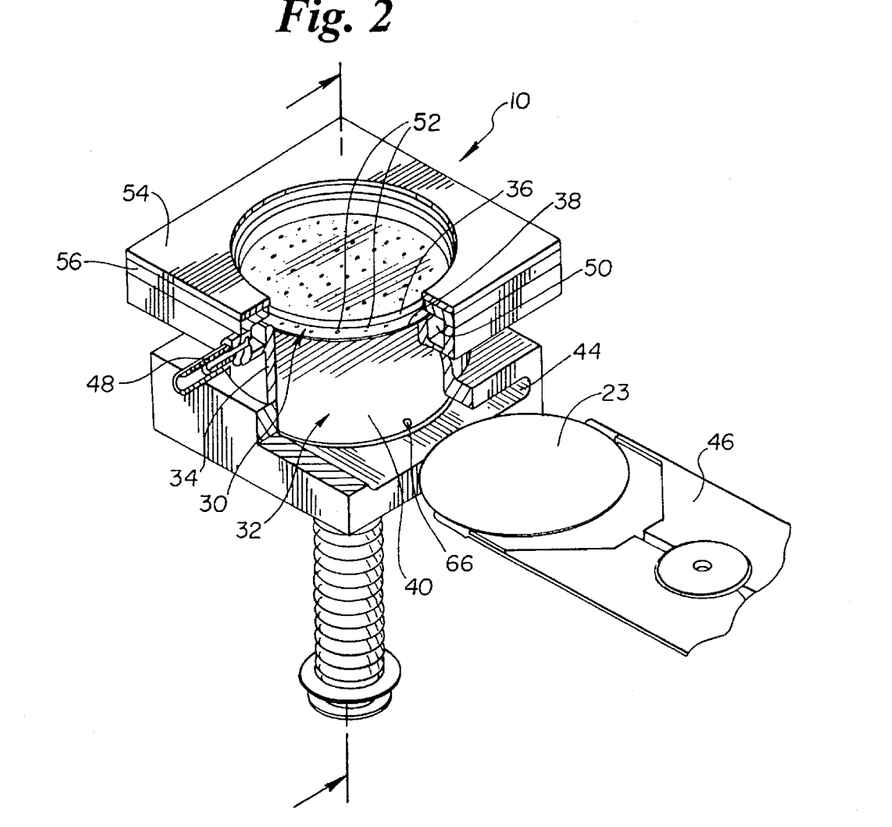
FIG. 2 is a front perspective view of the first embodiment of the invention with a portion cut away.

FIG. 2 is a more detailed view of the first embodiment of the inventive chamber 10. The chamber 10 is a hermetically sealed chamber, constructed from aluminum and coated by a hardcoat anodization process, and is divided into two regions, a higher pressure gas inlet region, shown generally at 30 and a lower pressure reaction region shown generally at 32. Although hard-coated aluminum is preferred for the construction of the chamber 10, any material that does not etch, corrode or release contaminants could be used, such as ceramics or SiC. The gas inlet region 30 (first region discussed above in connection with FIG. 1) is defined by the chamber wall 34, a solid plate 36 and a perforated plate 38, each made of a material which is transparent to light of a selected range of wavelengths and inert so it does not react with the gas. In the preferred embodiment plates 36 and 38 are made of sapphire, which is transparent to both UV and IR wavelengths of light and is inert. For example calcium fluoride $CaF_2$ or magnesium fluoride $MgF_2$ could also be used for plates 36 and 38, but are more costly than sapphire. Plates 36 and 38 are transparent to UV and IR light, allowing the light from the UV lamp 14 and the IR lamp(s) 16, to penetrate to the surface of the substrate 23.

The conditioning gas can be any type of gas known for use in etching, cleaning, bulk stripping or otherwise conditioning the surface of a substrate, but in the preferred embodiment the gas will be comprised of an inert gas such as nitrogen mixed with a reactive gas. The reactive gas may be any type of well known reactive gas, for example HF, HF/water vapor, HF/alcohol vapor, a photolyzable fluorine containing gas such as $ClF_3$, $F_2$ or a $ClF_3/Cl_2$ mixture, or may also be the effluent of a gas plasma from a downstream plasma source, as discussed in Bersin above, having at least one reactive specie, but being substantially free of electrically charged particles (i.e. a plasma-less gas). Mixtures of reactive gases may also be employed. For light cleaning the reactive gas may be as low as 1% of the gas, while in bulk stripping the gas may be 100% reactive gas. If the process to be performed does not require photochemical activation, then plates 36 and 38 could be made of an opaque material. In the processes in which a photoreactive gas is used, it should be understood that other materials could be used, as long as they are transparent to the wavelength of light desired to activate the gas, and, if desired, heat the substrate and inert. The substrate in the preferred embodiment is most commonly a semiconductor substrate, but could be any type of substrate upon which surface conditioning is desired. For example, a glass substrate, such as a flat panel display; a thin film substrate such as thin film disk heads, or a ceramic substrate.

The reaction region 32 (second region discussed above in connection with FIG. 1) is defined by the chamber wall 34, the perforated plate 38 and a baffle plate 40 which slides vertically within the reaction region to define a load position and a processing position (discussed in connection with FIGS. 3a and 3b). The semiconductor substrate, or wafer 23 is loaded into the chamber 10 through slot 44 using loading arm 46. A gate valve (not shown) is used to seal the slot 44 during processing.

The conditioning gas is supplied through gas manifold 48 to annular channel 50, which opens into the gas inlet region 30. Gas is introduced into the annular channel 50 surrounding the chamber and then flows through the gap between the solid sapphire plate 36 and the perforated sapphire plate 38 and then through the perforations 52 in the perforated sapphire plate into the reaction region 32 between the perforated sapphire plate 38 and the baffle plate 40. The annular channel 50 is designed so that its flow conductance is larger compared to the flow conductance of the gap between the solid sapphire plate 36 and the perforated sapphire plate 38 so that the pressure in the annular channel 50 is approximately equal around the entire circumference even though the reactive gases are introduced to the channel through a single small diameter tube 48. Applicants have found that the flow conductance of the annular channel should be at least 10 times the flow conductance of the gap between the plates to insure that the gas feeds uniformly around the circumference of the annular channel. The isobaric nature of the annular ring 50 provides circumferential uniform flow of the gas from the edge to the center of the perforated plate 38. Further, the size and plurality of the perforations 52 in the perforated sapphire plate 38 are designed so that the flow conductance of the perforations 52 is much less than the flow conductance of the gap between the solid sapphire plate 36 and the perforated sapphire plate 38 so that the flow of gas through each perforation 52 is approximately equal. Top clamp 54 is used to hold solid sapphire plate 36 in place. Channel cover 56, together with chamber wall 34 defines the annular channel gap through which conditioning gas flows into the gas inlet region 30. In the embodiment of FIGS. 1–8 the pump 18 attaches at the bottom of exhaust manifold 62, shown at 69. Exhaust manifold 62 defines the circular exhaust outlet where it opens in baffle plate 40.

Figure 3A:
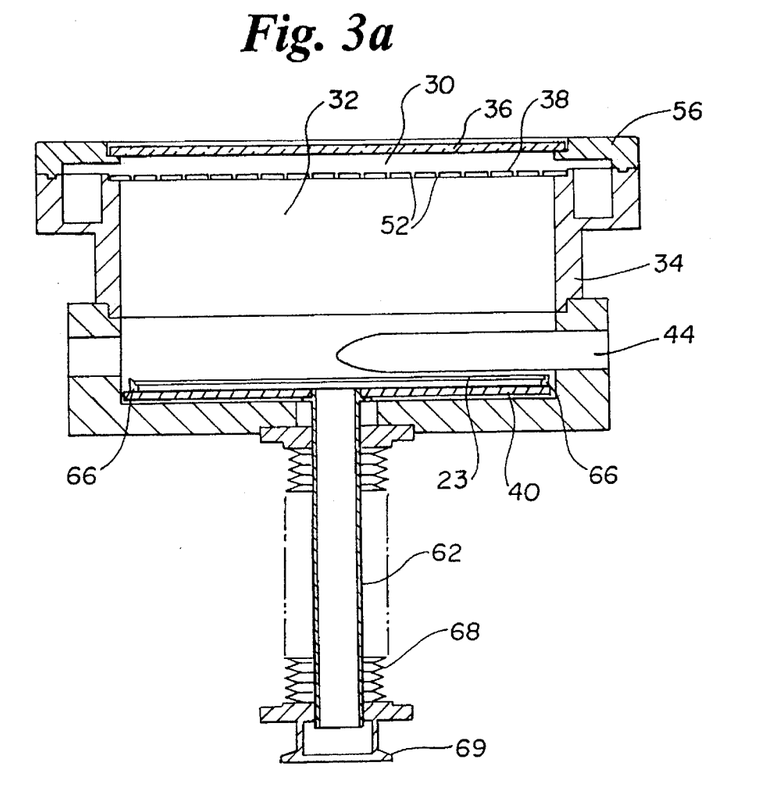
FIG. 3a is a cross sectional view of the first embodiment in the load position.
Figure 3B:
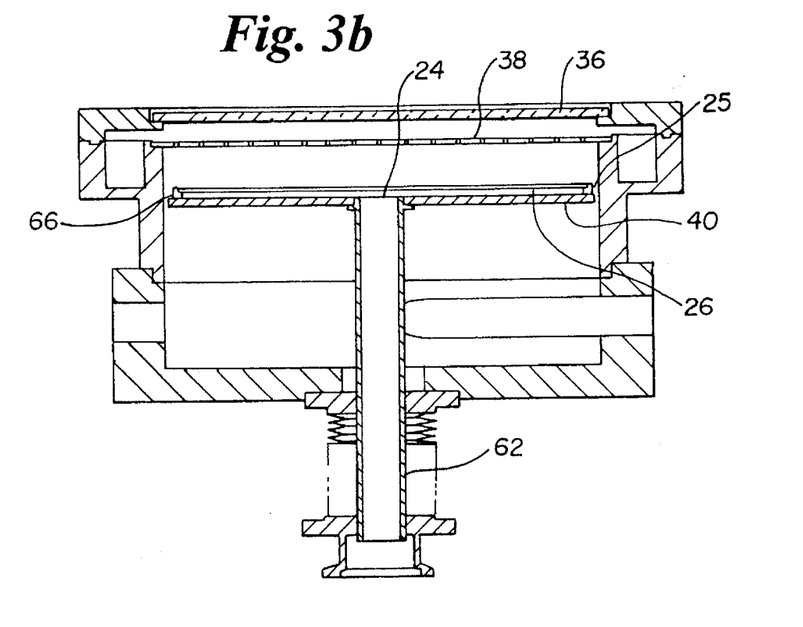
FIG. 3b is a cross sectional view of the first embodiment in the processing position.

Referring now to FIGS. 3a and 3b, the "load" and "processing positions of the chamber 10 are shown in cross-sectional views. The semiconductor substrate is resting on three support pins 66 which are also mounted to baffle plate 40. Baffle plate 40 is vertically slidable within the chamber 10, and is shown in FIG. 3b in the processing position. A mechanism (not shown) raises or lowers exhaust manifold 62, carrying the baffle plate 40 with it. Flexible bellows seal 68 provides a seal which allows movement of the exhaust manifold 62. It can be seen that in the "processing" position, the reaction chamber 32 is a smaller volume, and is effectively isolated from the rest of the chamber by baffle plate 40, which is configured so that the flow conductance around the edge of the baffle plate is at least 10 times smaller than the flow conductance above the baffle plate to insure that the gas flows above the baffle plate to the exhaust port rather than into the lower chamber. A typical wafer has an 8 inch diameter (approximately 200 mm) and the chamber in this embodiment has approximately an 8½ inch diameter (approximately 216 mm). Therefore, it can be seen that peripheral gap 25, defined between wafer 23 and chamber wall 34, is approximately ¼ inch (6.35 mm) when used with a 200 mm wafer. The peripheral gap 25 would be larger when used with a 150 mm wafer, but the invention works in the same fashion. Wafer 23 is supported on pins 66 so that it defines a pumpout gap 26, which is approximately 8 mm in this embodiment, between wafer 23 and baffle plate 40.

Figure 4:
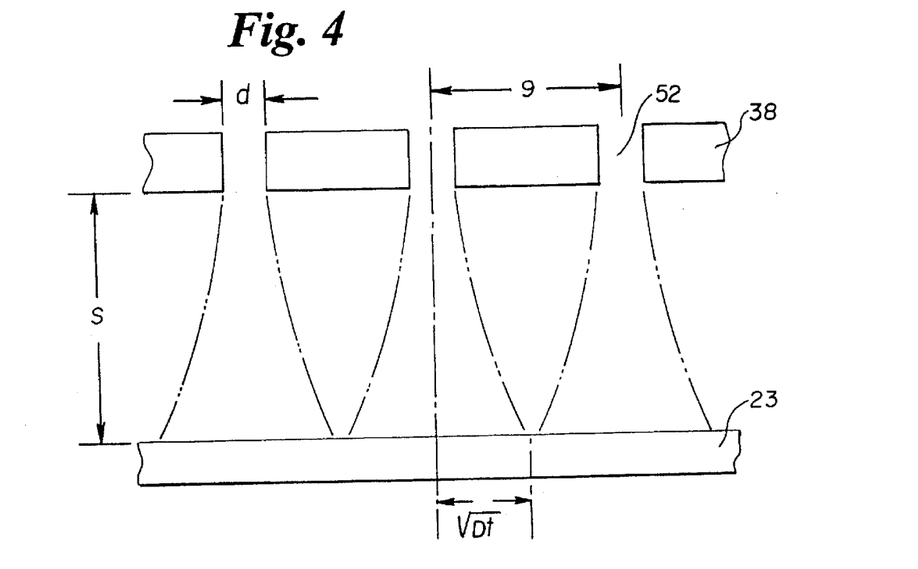
FIG. 4 is a schematic of the parameters for determining the diffusional mixing between the perforated plate and the substrate.

Applicants have experimented with various numbers of perforations, perforation spacing, flow rate, and spacing between the plate 38 and the surface of the semiconductor substrate or wafer. FIG. 4 is a schematic showing the various dimensions and parameters involved in determining the diffusion of the conditioning gas between the perforated plate 38 and the wafer surface. S is the distance between the perforated plate 38 and the wafer surface, g is the center to center distance between perforations, d is the diameter of a perforation and $\sqrt{Dt}$ is the characteristic diffusion length.

In the tests the diameter d was 1 mm in a 1.9 mm thick sapphire or aluminum plate. Thermal oxide on silicon wafers was etched at total flows of 500 and 2000 sccm in an HF/IPA oxide etching system, and at spacings (S) of 1 and 6 cm, using a 69-hole, 12.7 mm pitch (g) hole pattern (sapphire plate), a 69-hole, 6.3 mm pitch hole pattern (aluminum plate), and a 221 hole, 12.7 mm pitch hole pattern (aluminum plate). Pressure, temperature and process time were held constant. The reactor pressure was 100 torr, the temperature was 40° C. and the process time was 5 minutes. The etching rate of oxide was determined by measuring the oxide film thickness with a spectroscopic reflectometer before and after the process run. 150 mm diameter wafers and 200 mm diameter wafers were used. The test results are shown in Table 1 below:

| Run # | wafer size (mm) | g (mm) | holes (n) | total flow (sccm) | s (cm) | X | rate (Å/min) | COV (%) | pattern on wafer |
|---|---|---|---|---|---|---|---|---|---|
| 1 | 150 | 12.7 | 69 | 2000 | 1 | 0.05 | 133 | 30 | yes |
| 2 | 150 | 12.7 | 69 | 2000 | 6 | 0.13 | 190 | 9.5 | no |
| 3 | 150 | 12.7 | 69 | 500 | 1 | 0.10 | 137 | 8.2 | yes |
| 4 | 150 | 12.7 | 69 | 500 | 6 | 0.25 | 81.5 | 6.2 | no |
| 5 | 150 | 6.35 | 69 | 2000 | 1 | 0.10 | 328 | 14.3 | no |
| 6 | 150 | 6.35 | 69 | 2000 | 6 | 0.26 | 241 | 3.0 | no |
| 7 | 150 | 6.35 | 69 | 500 | 1 | 0.21 | 161 | 7.0 | no |
| 8 | 200 | 12.7 | 221 | 2000 | 1 | 0.09 | 269 | 1.8 | slight |
| 9 | 200 | 112.7 | 221 | 2000 | 6 | 0.22 | 211 | 2.0 | no |
| 10 | 200 | 12.7 | 221 | 500 | 1 | 0.18 | 143 | 3.4 | no |
| 11 | 200 | 12.7 | 221 | 500 | 6 | 0.45 | 76 | 4.1 | no |

A rough calculation of the amount of diffusional mixing from the incoming streams from the perforations was made by assuming the binary diffusion of the reactant from each stream perpendicular to the flow of the stream as illustrated in FIG. 4. The ratio of the characteristic diffusion length for each stream to the distance between each perforation, X, is used as a dimensionless variable to the measure the extent of diffusional mixing.

$$x = \frac{\sqrt{Dt}}{g}$$

where D is the binary diffusivity of the reactant gas in the nitrogen diluent, t is the time for the flow to travel from the perforation to the wafer surface (the perforation to wafer spacing divided by average velocity of gas as it leaves the perforation), and g is the center to center perforation spacing. It can be shown that X goes as the +0.5 power of s and the −0.5 power of the mass flow. The data shows a strong correlation between uniformity and X. It would appear from the data that an X greater than 0.10 prevented a pattern from appearing below the perforations and provided good etching uniformity.

It was also calculated that with the entrance pressure set at 100 torr (measured at the opening of the annular channel into the gas inlet region) that the pressure drop to the center of the perforated plate was insignificant, measuring approximately 0.02–0.16 mTorr, that the greatest pressure drop took place through the perforations 2.9–38 mTorr, and that the pressure drop through the peripheral gap, the outlet gap and to the exhaust outlet was approximately 0.08–0.36 mTorr. Therefore, it can be seen that the pressure drop from the entrance to the exit is small relative to the pressure at the entrance, thereby ensuring a viscous flow regime. The pressure across the perforated plate dominates all other pressure drops. This assures that the pressure drop across the perforated plate will be radially uniform, resulting in a uniform flow of gas through each perforation.

Copending application Ser. No. 08/292,359 filed Aug. 18, 1994 discloses a process for selective etching of silicon nitride using a photolyzable fluorine containing gas such as $ClF_3/Cl_2$ mixture. The intensity of UV required to achieve suitable activation above the substrate over the range of 180–400 nm is desirably at least 50 mW/cm$^2$, preferably at least 200 mW/cm$^2$. A typical broad-band UV source useful in the invention will provide an integrated intensity over the 180–400 nm range of about 250 mW/cm$^2$ with a intensity at 254±5 nm of about 25 mW/cm$^2$.

Applicants have found that with a gas inlet pressure of 100 torr that a grid pattern of perforations 52 of between 6 and 13 mm, center to center, with each perforation being approximately 1 mm in diameter allows the reactive gas to uniformly fill the gas inlet region 30 so that approximately equal amounts of gas will flow through each perforation 52 from the higher pressure gas inlet region 30 to the lower pressure reaction region 32.

Copending application Ser. No. 08/259,542 filed Jun. 14, 1994 discloses a cleaning method for removing silicon oxides, as well as metals or other contaminants, from the surface of the substrate such as silicon, gallium, arsenide, or silicon oxide. The process utilizes a conditioning gas which includes at least one photolyzable fluorine containing gas such as $ClF_3$, optionally with a facilitating gas such as chlorine, and/or an inert gas such as dry nitrogen. The substrate is exposed to UV irradiation in the presence of the conditioning gas. Typical conditions use a conditioning gas of 1–90% $ClF_3$, 0–25% $Cl_2$, and the balance nitrogen, at a total gas pressure of about 100 torr and a flow rate of 1000 sccm and broad band UV irradiation from a medium pressure mercury arc lamp. The process can be used to remove silicon oxide, giving very low selectivity between various oxide forms, as well as to remove metallic contamination, from semiconductor substrates. The cleaning method of Ser. No. 08/259,542 is specially advantageous when practiced utilizing the apparatus and method of the present invention.

Figure 5:
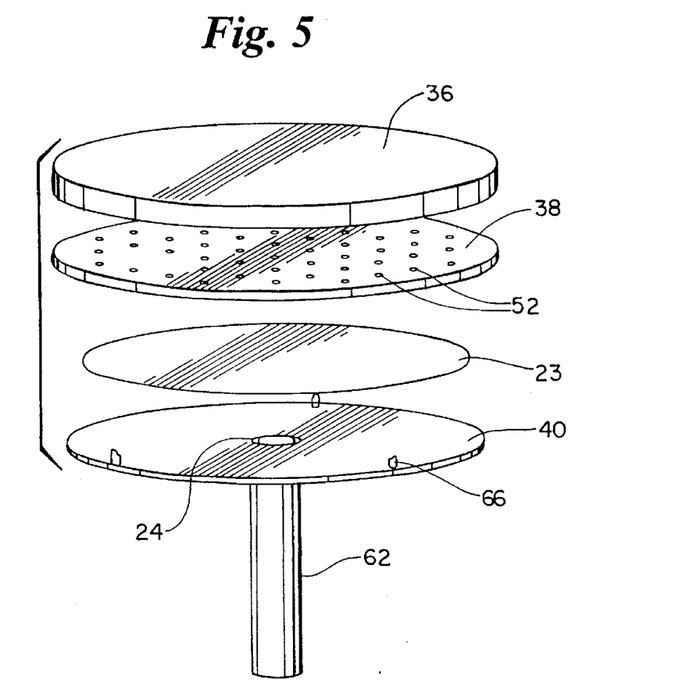
FIG. 5 is an exploded schematic view showing the flow of conditioning gas through the first embodiment.

Referring now to FIGS. 3a–3b and FIG. 5, an exploded schematic view showing the conditioning gas flow is shown. The conditioning gas flows out of annular channel 50 and into the gas inlet region 30, where it quickly fills the region, relative to the amount of gas flowing through perforations 52. This causes the gas to flow through perforations 52 in approximately equal amounts. The conditioning gas flows towards the wafer 23, carried in part by the pressure differential between the gas inlet region 30 and the reaction region 32. The UV radiation from UV lamp 14 is of sufficient intensity as discussed above, such that it penetrates the solid sapphire layer 36 and the perforated sapphire layer 38 to reach the surface of wafer 23, where it activates the gas at the surface, i.e. directly over or on the wafer surface. The activated gas particles chemically react with the wafer surface. The peripheral gap 25, the pumpout gap 26 and the pressure bias set at the pumpout outlet 24 create a uniform radial circumferential gas flow which causes the gas, after it has reacted with the wafer surface, to flow radially outward to the wafer edge, then through the peripheral gap 25, under the surface of the wafer and out the outlet 24. An important feature of the invention is that wherever the gas strikes the wafer surface, the flow caused by the peripheral gap 25, the pumpout gap 26 and the outlet 24 causes the gas to radially flow from its position over the wafer to the nearest radial edge. This flow allows the gas the minimum residence time after reaction, and therefore minimizes recontamination of the wafer surface. Another important feature of the pumpout gap 26 is that any activated gas which has not reacted with the wafer top surface can have a conditioning effect on the bottom surface of the wafer as it flows toward the outlet 24.

Figure 6:
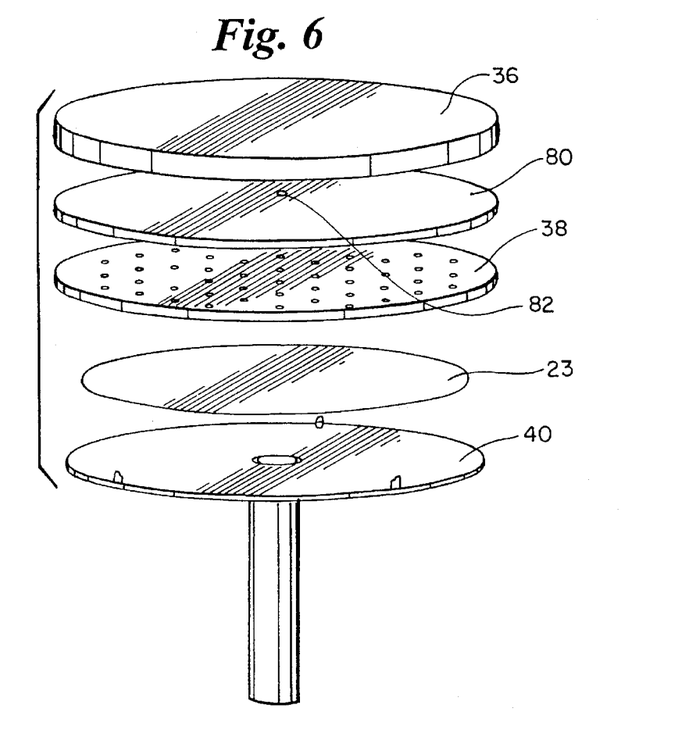
FIG. 6 is an exploded schematic view of an alternate embodiment of the gas inlet showing the flow of conditioning gas through the apparatus.

Referring now to FIGS. 3a–3b and FIG. 6, an alternate embodiment of the gas inlet region is shown in schematic exploded form. The gas is feed directly into a region defined by the solid sapphire plate 36, and a second solid sapphire plate 80 which contains a single centrally located perforation 82. The gas flows through perforation 82, and uniformly fills the region between plate 80 and plate 38. The flow conductance of perforation 82 is greater than the flow conductances of perforations 52, such that the gas uniformly fills the space so that approximately equal amounts of gas flow through perforations 52. Plate 80 replaces the annular channel 50 of the first embodiment while still allowing uniform flow through each of perforations 52.

Figure 7A:
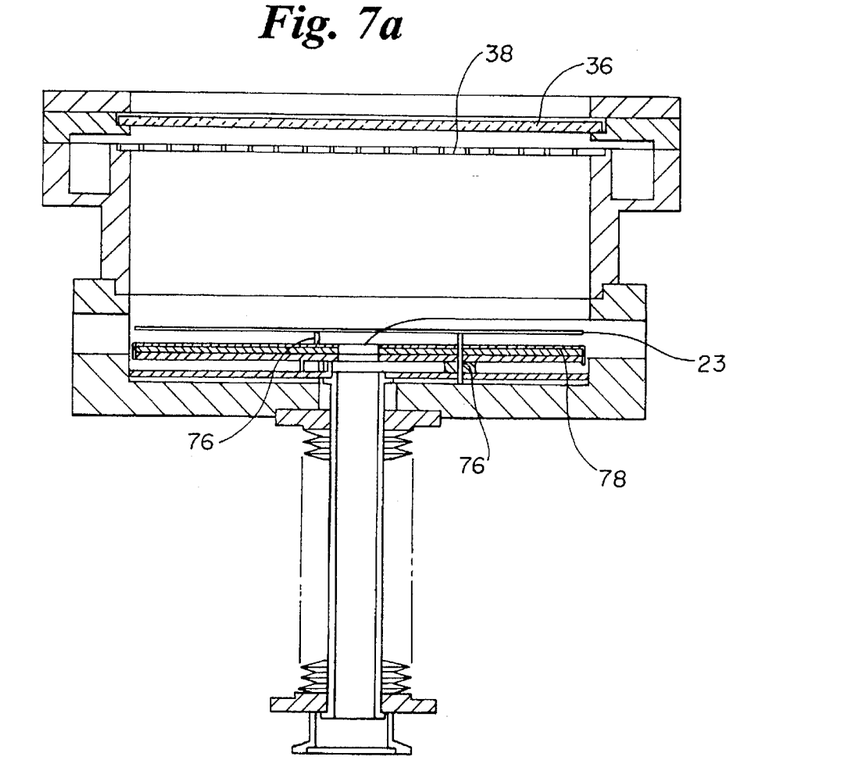
FIG. 7a is a cross sectional view of an alternate embodiment of the apparatus, shown in the load position.
Figure 7B:
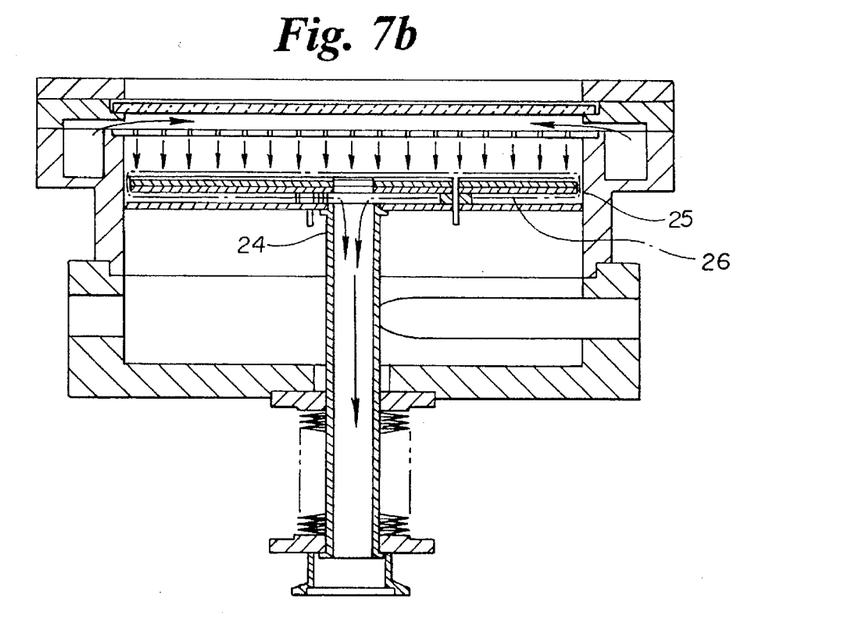
FIG. 7b is a cross sectional view of FIG. 7a shown in the processing position.

Referring now to FIGS. 7a and 7b, an alternate embodiment showing a modified substrate support is shown in which the wafer 23 rests on pins 76, which extend through a heater plate assembly 78. The heater plate assembly 78 is an alternative to heating the wafer surface externally using IR radiation, and is well known in the art. The heater plate assembly 78 is mounted on the baffle plate 40 to create pumpout gap 26 and peripheral gap 25, between the chamber wall 34 and heater plate assembly 78. In the processing position, shown in FIG. 7b, pins 76 retract so that the wafer 23 rests directly on the heater plate assembly. The gas flows toward the wafer surface, then radially toward the circumference of the wafer, through peripheral gap 25, through pumpout gap 26 and out outlet 24, as described above.

Figure 8:
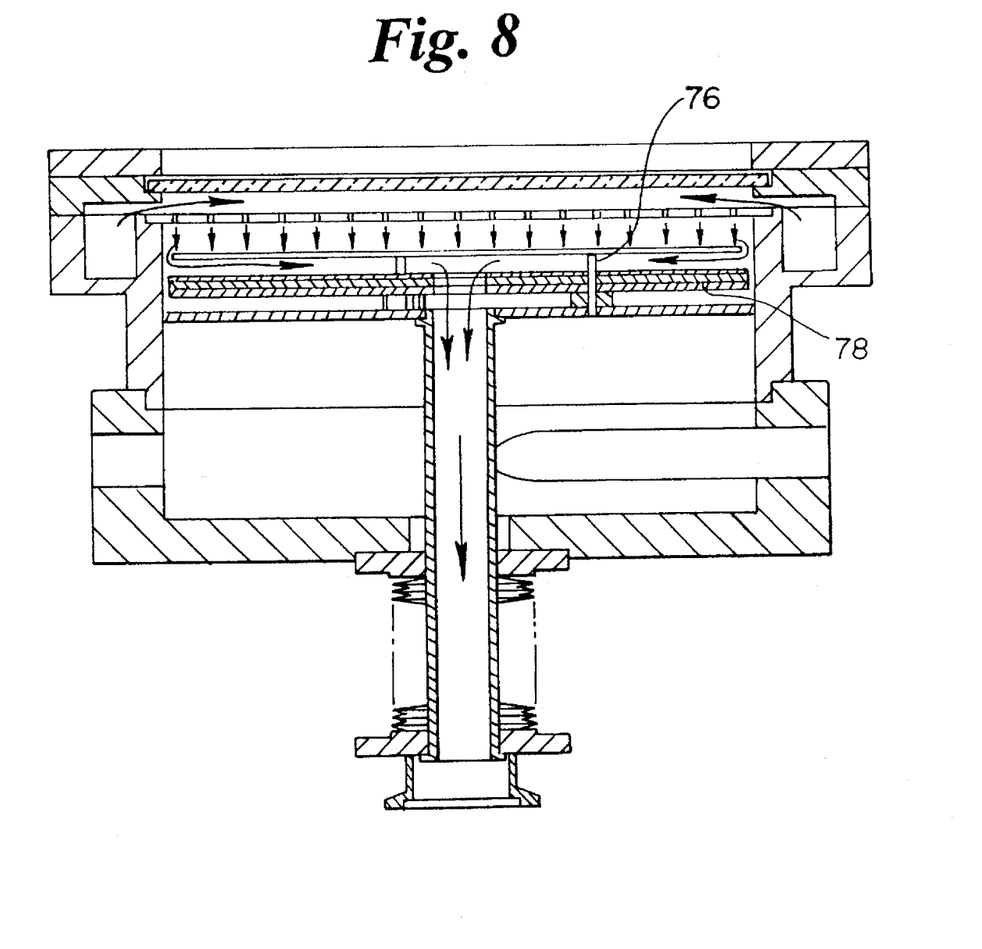
FIG. 8 is a cross sectional view of yet another alternate embodiment of the apparatus.

Referring now to FIG. 8, a modification to the embodiment of FIGS. 7a and 7b is shown in which pins 76 are fixed to provide a gap between the wafer and the heater plate assembly, to allow conditioning of the bottom surface of the wafer 23. Heater plate 78 contains an outlet 81 positioned over outlet 24 to allow gas to exit directly to the outlet 24 after conditioning the bottom surface of wafer 23. In order to change the height of the gap between the wafer and the heater plate assembly, pins 76 may optionally retract, lowering the wafer to rest on pins 66. The heater plate assembly is covered by cover plate 79, which may be extended to narrow gap 25 to cause the conditioning gas to preferentially flow under the surface of the substrate and through outlet 81.

Figure 9:
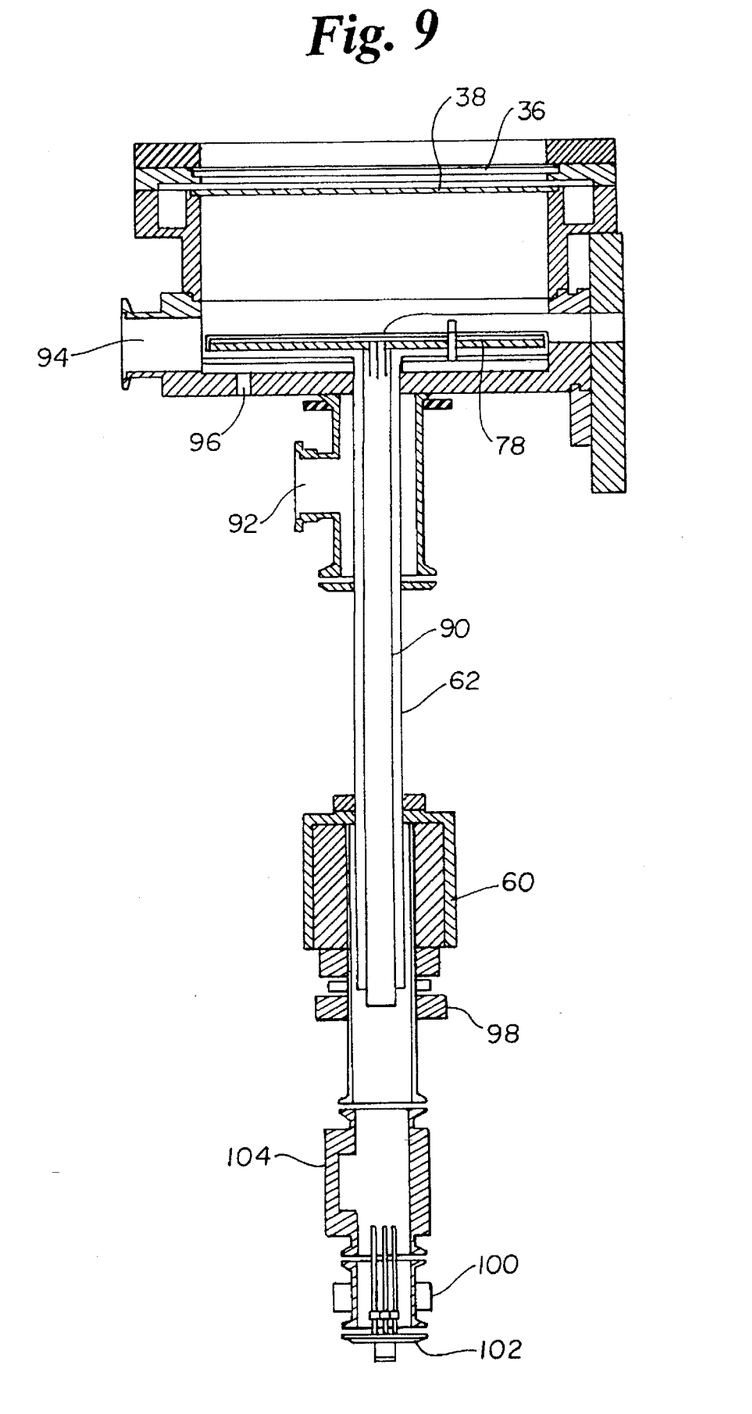
FIG. 9 is a cross sectional view of a further alternate embodiment of the apparatus.

Referring now to FIG. 9, an alternate embodiment of chamber 10 is shown in which a rotary feedthrough 60 is connected to pipes 62 and 90, which rotate together inside bellows 68. Pipe 62 terminates at the baffle plate 40, and pipe 90 terminates at the heater plate assembly 78. Rotary feedthroughs are well known in the art and rotary feedthrough 60 is used to allow slow rotation of the baffle plate and heater plate assembly so as to ensure more uniform exposure to UV radiation. As is well known in the art, the rotary feedthrough is comprised of a stationary portion 91 and the rotating portion 93. An inert gas, such as nitrogen, is fed to pipe 90 to the heater plate assembly, where it fills the space between the two plates which contains the heating coil. The nitrogen leaks out the sides of the heater plate assembly and is carried to exhaust outlet 24. The inert gas is used as a sealing gas to protect the heating coil during processing. The gas exits the chamber through manifold 62, in the annulus between pipe 90 and manifold 62, through a port and out outlet 92, which is connected to a vacuum pump (not shown). The vacuum pump can pump the chamber down to less than 10 mTorr, and if further pump out is required, high vacuum pump port 94 can be used. Typically, pump port 94 would be used either right before removing the wafer from the chamber, or possibly between processing runs. Chamber 10 can also optionally be equipped with purge inlet 96, through which an inert sealing gas can be fed into the chamber below the baffle plate at a pressure which is between the pressure below the baffle plate and the pressure in the pumpout gap, to prevent conditioning gas from flowing below the baffle plate. Heater plate purge gas inlet 98 is a rotating seal for feeding nitrogen gas to the heater plate assembly through pipe 90. An electrical slip ring assembly is shown at 100 and an electrical feed through is shown at 102. An access port 104 is also provided for assembly and maintenance.

It should be understood that when the invention is used with a reactant gas, it is typically mixed with an inert gas, such as nitrogen in various amounts depending on the process to be done. For example, for light cleaning the reactant could be as low as 1% and for bulk stripping as high as 100%. It should also be understood that rather than altering the amount of reactant gas it is also possible to alter the rate of chemical reaction by changing the intensity of the UV radiation, or pulsing the UV radiation.

This completes the description of the preferred and alternate embodiments of the invention. It is to be understood that even though numerous characteristics and advantages of the present invention have been set forth in the foregoing description, together with the details of the structure and function of the invention, the disclosure is illustrative only and changes may be made in detail, especially in matters of shape, size and arrangement of parts within the principals of the invention, to the full extent indicated by the broad, general meaning of the terms in which the appended claims are expressed. Those skilled in the art may recognize other equivalents to the specific embodiment described herein which are intended to be encompassed by the claims attached hereto.

What is claimed is:

1. Apparatus for conditioning a substrate, contained in a hermetically sealed chamber fed with a conditioning gas comprising a reactive gas, comprising:

support means for supporting the substrate in the chamber;

first pressure bias means for establishing a first pressure bias in the chamber such that the substrate is in a second lower pressure portion of the chamber than a first gas inlet portion of the chamber, both said first and second chamber portions operating in a viscous flow regime;

gas inlet means for feeding conditioning gas into the gas inlet portion of the chamber so that the pressure differential causes the conditioning gas to flow toward the surface of the substrate wherein the reactive gas component thereof will chemically react with and condition the substrate surface;

second pressure bias means for creating a second pressure bias across the surface of the substrate such that the conditioning gas, after it has chemically reacted with the substrate surface, flows radially outward from where it has reacted, toward the nearest edge of the substrate, and exhaust means for exhausting gas from the chamber.

2. The apparatus of claim 1 wherein the conditioning gas is a UV activatible gas and the apparatus further includes a light generator provided externally of the chamber to irradiate the conditioning gas with UV light of sufficient intensity so that conditioning gas activation may take place directly at the substrate surface.

3. The apparatus of claim 2 wherein the chamber and substrate are circular and the second pressure bias means comprises:

substrate support means for supporting the substrate so that a uniform peripheral gap is formed between the substrate and the chamber wall;

circular outlet means located centrally beneath the substrate and providing connection to said exhaust means for exhausting gas from the chamber, and the substrate being supported so that a pumpout gap is formed between the substrate and the exhaust outlet, and the pressure at the circular outlet means is arranged such that a pressure bias is formed on the substrate surface causing the conditioning gas, after it has chemically reacted with the substrate surface and flowed radially outward toward the nearest edge of the substrate, it flows through the peripheral gap, through the pumpout gap and out the circular outlet means.

4. The apparatus of claim 3 wherein the first pressure bias means comprises:

feeding means for feeding the gas into a gas inlet region in the chamber wherein the bottom of the gas inlet region is a perforated layer of material which is transparent to a wavelength range of light, the flow conductance of the gas inlet region being greater than the flow conductance of the perforations, such that the gas fills the gas inlet region and the flow of gas through each perforation is substantially equal, and wherein the substrate is supported at a distance below the perforated layer of material such that the diffusion velocity of the gas after it has passed through the perforations is such that it will uniformly mix with the gas already resident over the substrate before it reaches the substrate surface whereby the flow of gas toward the surface of the substrate is laterally uniform over the substrate surface.

5. The apparatus of claim 4 wherein the top of the gas inlet region is defined by a solid layer of material which is transparent to a wavelength range of light and which is spaced above the perforated layer of material; the conditioning gas is fed into an annular channel which opens into the gas inlet region; and the flow conductance of the annular channel is large compared to the flow conductance of the gas inlet region so that the pressure in the annular channel is substantially equal around its entire circumference, whereby an even flow of conditioning gas from the annular channel to the center of the perforated plate is provided.

6. The apparatus of claim 3 further including heating means for heating the substrate.

7. The apparatus of claim 6 wherein the heating means is an infrared light generator provided externally of the chamber.

8. The apparatus of claim 6 wherein the heating means is a heater plate assembly supporting the substrate; wherein the peripheral gap is defined by the gap between the chamber wall and the heater plate assembly, and the pumpout gap is defined between the heater plate assembly and a baffle plate, the heater plate assembly being mounted on the baffle plate and the circular outlet means being located in the baffle plate centrally beneath the heater plate assembly and the substrate.

9. The apparatus of claim 8 wherein the substrate is supported on the heater plate assembly such that a gap exists between the substrate and the heater plate assembly to allow the flow of conditioning gas to reach the bottom surface of the substrate.

10. The apparatus of claim 9 further including heater plate rotating means for rotating the heater plate assembly to cause a more uniform incidence of irradiating light to enable more uniform gas activation of the conditioning gas at the substrate.

11. The apparatus of claim 1 further including means for vertically raising the support means within the chamber after the substrate is loaded into the chamber to define a lower volume reaction chamber.

12. The apparatus of claim 3 further including inert gas inlet means below the substrate support for feeding inert gas into the chamber below the substrate support.

13. The apparatus of claim 12 further including:
    substrate temperature sensor means for measuring the temperature of the substrate during processing;
    pressure sensor means for measuring the pressure during processing, and
    gas sensor means for monitoring the gas species present in the chamber.

14. The apparatus of claim 4 wherein each perforation in the perforated layer of material is circular, the diameter of each perforation is equal, and the perforations are formed in a grid pattern.

15. A process for conditioning a substrate, contained in a hermetically sealed chamber fed with a conditioning gas comprising a reactive gas, comprising:
    supporting the substrate in the chamber;
    establishing a first pressure bias in the chamber such that the substrate is in a second lower pressure portion of the chamber than a first gas inlet portion of the chamber, both said first and second chamber portions operating in a viscous flow regime;
    feeding said conditioning gas into the gas inlet portion of the chamber so that the pressure differential causes the conditioning gas to flow toward the surface of the substrate wherein the reactive gas component thereof will chemically react with and condition the substrate surface;
    creating a second pressure bias across the surface of the substrate such that the conditioning gas, after it has chemically reacted with the substrate surface, flows radially outward from where it has reacted, toward the nearest edge of the substrate, and
    exhausting gas from the chamber.

16. The process of claim 15 wherein the conditioning gas is a UV activatible gas and further including the step of irradiating the conditioning gas with UV light using a light generator provided externally of the chamber, the light being of sufficient intensity so that conditioning gas activation may take place at the substrate surface.

17. The process of claim 16 wherein the chamber and substrate are circular and the second pressure bias is created by the further steps of:
    supporting the substrate so that a uniform peripheral gap is formed between the substrate and the chamber wall;
    locating a circular outlet centrally beneath the substrate which provides a connection to an exhaust outlet, and
    supporting the substrate so that a pumpout gap is formed between the substrate and the circular outlet, and
    setting the pressure at the circular outlet such that a pressure bias is formed on the substrate surface causing the gas, after it has chemically reacted with the substrate surface and flowed radially outward toward the nearest edge of the substrate, it flows through the peripheral gap, through the pumpout gap and through the circular outlet.

18. The process of claim 17 wherein the first pressure bias is created by the further step of:
    feeding the conditioning gas into a gas inlet region in the chamber wherein the bottom of the gas inlet region is a perforated layer of material which is transparent to a wavelength range of light, the flow conductance of the gas inlet region being greater than the flow conductance of the perforations, such that the conditioning gas fills the gas inlet region and the flow of conditioning gas through each perforation is substantially equal,
    and including the further step of supporting the substrate at a distance below the perforated layer of material such that the diffusion velocity of the conditioning gas after it has passed through the perforations is such that it will uniformly mix with the gas already resident over the substrate before it reaches the substrate surface whereby the flow of gas toward the surface of the substrate is laterally uniform over the substrate surface.

19. The process of claim 18 wherein the top of the gas inlet region is defined by a solid layer of material which is transparent to a wavelength range of light and which is spaced above the perforated layer of material, further including the step of feeding the conditioning gas into an annular channel which opens into the gas inlet region, and the flow conductance of the annular channel is large compared to the flow conductance of the gas inlet region so that the pressure in the annular channel is substantially equal around its entire circumference, which causes an even flow of conditioning gas from the annular channel to the center of the perforated plate.

20. The process of claim 17 further including the step of heating the substrate.

21. The process of claim 20 wherein the heating is caused by the further step of using an infrared light generator provided externally of the chamber.

22. The process of claim 20 wherein the heating is caused by the further step of supporting the substrate on a heater plate assembly and wherein the peripheral gap is defined by the gap between the chamber wall and the heater plate assembly; the pumpout gap is defined between the heater plate assembly and a baffle plate; the heater plate assembly being mounted on the baffle plate and the circular outlet being located in the baffle plate centrally beneath the heater plate assembly and the substrate.

23. The process of claim 22 wherein the substrate is supported on the heater plate assembly such that a gap exists between the substrate and the heater plate assembly to allow the flow of conditioning gas to reach the bottom surface of the substrate.

24. The process of claim 22 further including the step of rotating the heater plate assembly to cause a more uniform incidence of irradiating light to enable more uniform gas activation of the conditioning gas at the substrate.

25. The process of claim 15 further including the step of vertically raising the support within the chamber after the substrate is loaded into the chamber to define a lower volume reaction chamber.

26. The process of claim 17 wherein the pressure in the pumpout gap is lower than the pressure in the second chamber portion and further including the step of feeding an inert gas into the chamber below the support at a pressure which is between the pressure of the second chamber portion and the pressure in the pumpout gap, to prevent conditioning gas from flowing below the support, and wherein the inert gas is exhausted through the centrally located circular outlet along with the conditioning gas.

27. The process of claim 18 wherein each perforation in the perforated layer of material is circular, the diameter of each perforation is equal, and the perforations are formed in a grid pattern.

28. The process of claim 15 further including the steps of:

monitoring the pressure in the chamber, and controlling the flow of conditioning gas through the chamber to keep said flow constant during processing.

29. Apparatus for conditioning a substrate, contained in a hermetically sealed chamber fed with a conditioning gas comprising a reactive gas, comprising:

a support for supporting the substrate in the chamber, the substrate being in a lower pressure reaction region of the chamber;

a gas inlet for feeding conditioning gas into a gas inlet region of the chamber which is at a higher pressure than the lower pressure region so that the pressure differential between said gas inlet and reaction regions causes the conditioning gas to flow toward the surface of the substrate, wherein the reactive gas component will chemically react with the substrate surface, both said gas inlet and reaction regions operating in a viscous flow regime, and the substrate being supported so that a pressure bias is created across the surface of the substrate such that the conditioning gas, after it has chemically reacted with the substrate surface, flows radially outward from where it has reacted, toward the nearest edge of the substrate and out an exhaust outlet.

30. The apparatus of claim 29 wherein the conditioning gas is a UV activatible gas and the apparatus further includes a light generator provided externally of the chamber to irradiate the conditioning gas with light of sufficient intensity so that conditioning gas activation may take place at the substrate surface.

31. The apparatus of claim 29 further including a heater for heating the substrate.

32. The apparatus of claim 31 wherein the heater is an infrared light generator provided externally of the chamber.

33. The apparatus of claim 31 wherein the heater is a heater plate assembly supporting the substrate; wherein a peripheral gap is defined by the gap between the chamber wall and the heater plate assembly; wherein a pumpout gap is defined between the heater plate assembly and a baffle plate, the heater plate assembly being mounted on the baffle plate, and wherein a circular outlet connecting to the exhaust is located in the baffle plate centrally beneath the heater plate assembly and the substrate.

34. The apparatus of claim 33 wherein the heater plate assembly is rotated to cause a more uniform incidence of irradiating light to enable more uniform gas activation of the conditioning gas at the substrate.

35. The apparatus of claim 33 wherein the baffle plate is vertically raised within the chamber after the substrate is loaded into the chamber to define a lower volume reaction chamber.

36. The apparatus of claim 33 further including an inert gas inlet below the support.

* * * * *